(12) United States Patent
Miyata

(10) Patent No.: US 10,082,271 B2
(45) Date of Patent: Sep. 25, 2018

(54) LASER LIGHT OPTICAL MODULE UTILIZING REFLECTIVE FILMS FOR IMPROVED EFFICIENCY

(71) Applicant: NICHIA CORPORATION, Anan-shi, Tokushima (JP)

(72) Inventor: Tadaaki Miyata, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/635,609

(22) Filed: Jun. 28, 2017

(65) Prior Publication Data

US 2018/0003362 A1 Jan. 4, 2018

(30) Foreign Application Priority Data

Jun. 29, 2016 (JP) .................................. 2016-128912
May 26, 2017 (JP) .................................. 2017-104545

(51) Int. Cl.
*F21V 19/02* (2006.01)
*F21V 7/22* (2018.01)
*F21V 23/00* (2015.01)

(52) U.S. Cl.
CPC .............. *F21V 7/22* (2013.01); *F21V 23/001* (2013.01)

(58) Field of Classification Search
CPC ... F21V 9/30; F21V 5/04; F21V 15/01; F21Y 2115/30; F21Y 2113/13; F21K 9/90; F21K 9/1375
See application file for complete search history.

(56) References Cited

U.S. PATENT DOCUMENTS

| 2005/0110157 A1 | 5/2005 | Sherrer et al. |
| 2007/0147456 A1 | 6/2007 | Sugita et al. |
| 2011/0170831 A1 | 7/2011 | Tamura |
| 2011/0285017 A1 | 11/2011 | Ninz et al. |

FOREIGN PATENT DOCUMENTS

| JP | 2003-297554 A | 10/2003 |
| JP | 2005-136384 A | 5/2005 |
| JP | 2011-142268 A | 7/2011 |
| JP | 2012-515441 A | 7/2012 |
| JP | 2014060452 A | 4/2014 |
| JP | 5866561 B1 | 2/2016 |
| WO | 2005057743 A1 | 6/2005 |

*Primary Examiner* — Tracie Y Green
(74) *Attorney, Agent, or Firm* — Hunton Andrews Kurth LLP

(57) ABSTRACT

A light source device includes a substrate having a principal surface, a light-transmitting member arranged over the principal surface of the substrate, and a laser light source arranged on the principal surface of the substrate at a portion in the bottom recess. The light-transmitting member has a lower surface that faces the principal surface of the substrate, an upper surface opposite to the lower surface, and a bottom recess opening downward. The laser light source is arranged on the principal surface of the substrate so that an optical axis of a laser beam emitted from the laser light source is substantially parallel to the principal surface of the substrate. At least a portion of the upper surface of the light-transmitting member is covered with an upper light reflection coat. At least a portion of the lower surface of the light-transmitting member is covered with a lower light reflection coat.

18 Claims, 5 Drawing Sheets

LASER LIGHT OPTICAL MODULE UTILIZING REFLECTIVE FILMS FOR IMPROVED EFFICIENCY

CROSS-REFERENCE TO RELATED APPLICATIONS

This application claims priority to Japanese Patent Application No. 2016-128912 filed on Jun. 29, 2016, and Japanese Patent Application No. 2017-104545 filed on May 26, 2017, the entire disclosures of which are hereby incorporated by reference.

BACKGROUND

The present disclosure relates to a light source device including a laser light source.

Light source devices with light-emitting elements such as a laser light source have been widely used. Among these, light source devices outputting a light in a direction parallel to a surface of a substrate thereof are expected to be applied in various fields such as backlighting devices.

To realize such a light emitting device, for example, in Japanese Unexamined Patent Publication No. 2011-142268, a light source device (or an optical module) configured to output light in a direction parallel to an upper surface of a substrate has been proposed in which a light is emitted upward from a light-emitting element mounted on the upper surface of the substrate and then reflected laterally by a reflective surface to be output in a direction parallel to the upper surface of the substrate.

SUMMARY

In the light source device described in Japanese Unexamined Patent Publication No. 2011-142268, light is emitted upward from a light-emitting element in a direction perpendicular to the upper surface of the substrate. With this structure, the light source device is required to have a size in an upper-lower direction including an optical path length between the light-emitting element and the reflective surface above the light-emitting element, increasing the size of the light source device. Further, the structure of the light source device described above requires a reflective member with such a reflective surface for reflecting light emitted from the light-emitting element and a lens between the light-emitting element and the reflective member. This arrangement further increases the size in the upper-lower direction. Accordingly, reduction in size of the light source device in upper-lower direction is limited. Further, with the reflective member and the lens, light output efficiency of the light source device may be reduced.

In view of the above, it is an object of the present disclosure to provide a light source device in which a laser light source is arranged so that an optical axis of a laser beam emitted from the laser light source is substantially parallel to an upper surface of a substrate and that can achieve reduction in size in an upper-lower direction, which is a direction perpendicular to the upper surface of the substrate, and high light output efficiency.

A light source device according to one embodiment of the present disclosure includes a substrate having a principal surface, a light-transmitting member arranged over the principal surface of the substrate, and a laser light source arranged on the principal surface of the substrate at a portion in the bottom recess. The light-transmitting member has a lower surface that faces the principal surface of the substrate, an upper surface opposite to the lower surface, and a bottom recess opening downward.

The laser light source is arranged on the principal surface of the substrate so that an optical axis of a laser beam emitted from the laser light source is substantially parallel to the principal surface of the substrate. At least a portion of the upper surface of the light-transmitting member to be irradiated with the laser beam is covered with an upper light reflection coat. At least a portion of the lower surface of the light-transmitting member to be irradiated with the laser beam is covered with a lower light reflection coat.

With this configuration, a light source device including a laser light source, having a size reduced in a direction perpendicular to the upper surface of the substrate, and having a high light output efficiency can be provided.

DETAILED DESCRIPTION

Certain embodiments of the present disclosure will be described below with reference to the accompanying drawings.

Light Source Device According to First Embodiment of the Present Disclosure

Figure 1A:
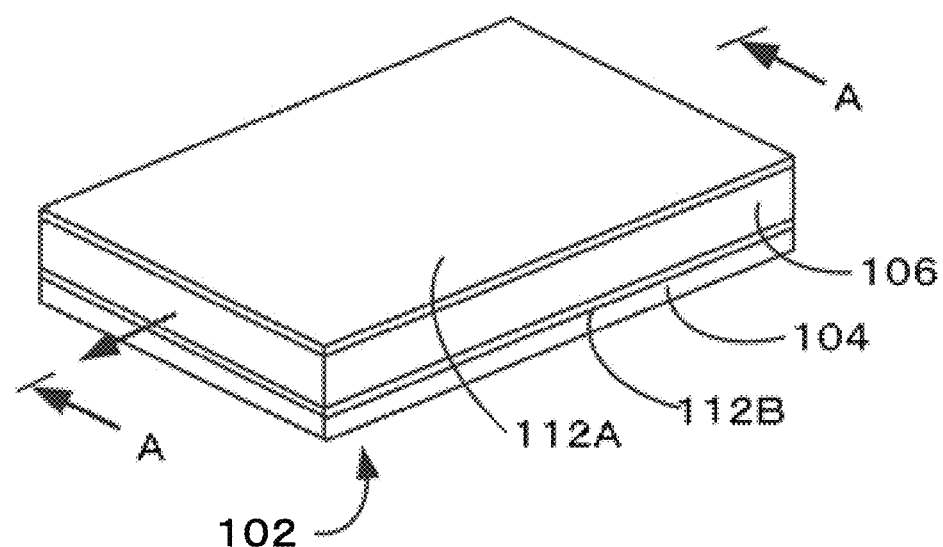
FIG. 1A is a perspective view schematically showing an appearance of a light source device according to a first embodiment of the present disclosure.
Figure 1B:
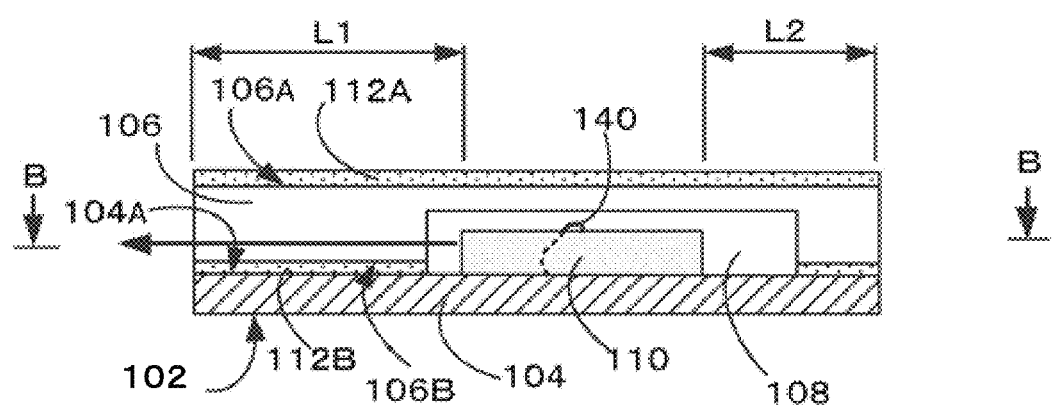
FIG. 1B is a cross-sectional view taken along the line A-A shown in FIG. 1A.
Figure 1C:
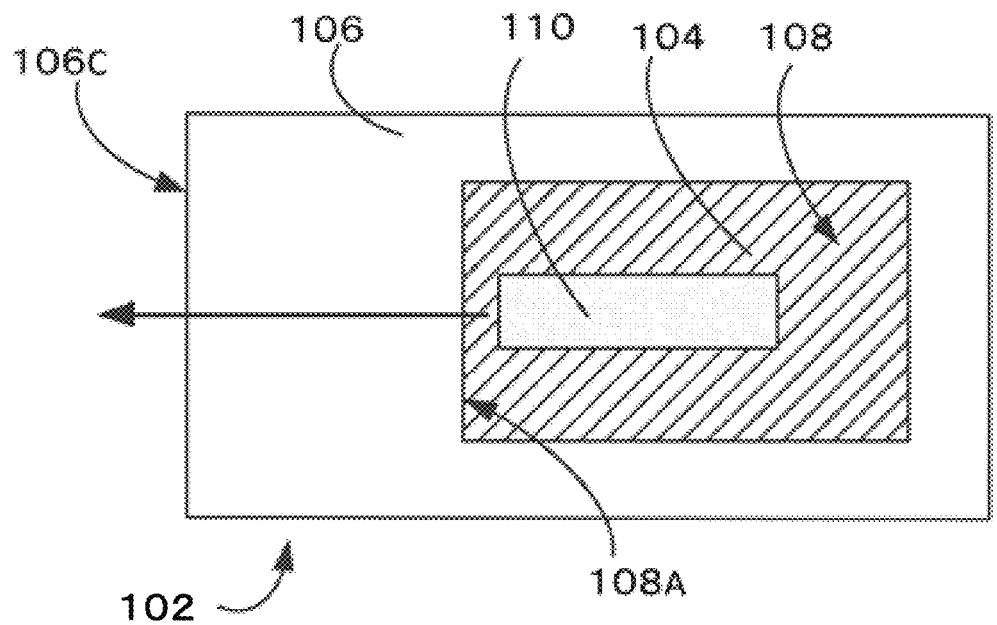
FIG. 1C is a plan sectional view taken along the line B-B shown in FIG. 1B.

First, a light source device 102 according to a first embodiment of the present disclosure will be described with reference to FIGS. 1A, 1B, and 1C. FIG. 1A is a perspective view schematically showing an appearance of the light source device 102. FIG. 1B is a cross-sectional view taken along the line A-A shown in FIG. 1A. FIG. 1C is a plan sectional view taken along the line B-B shown in FIG. 1B.

The light source device 102 includes a substrate 104, a light-transmitting member 106, and a laser light source 110. The light-transmitting member 106 is arranged on a principal surface 104A of the substrate 104, and has a lower surface 106B that faces the principal surface 104A of the substrate 104 and an upper surface 106A opposite to the lower surface 106B. The light-transmitting member 106 further has a bottom recess 108 opening downward (i.e., having opening in the lower surface 106B). The laser light source 110 is arranged on the principal surface 104A of the substrate 104 and inside of the bottom recess 108.

The principal surface 104A of the substrate 104 may not be entirely flat, and may have a recess. The laser light source 110 may be arranged in the recess of the principal surface 104A. Alternatively, the laser light source 110 may be mounted on the principal surface 104A of the substrate 104 via a sub-mount.

In each of FIGS. 1A to 3B, an optical axis of a laser beam emitted from the laser light source is indicated by a single-headed bold arrow. In FIG. 1B, the laser light source 110 is arranged on the principal surface 104A of the substrate 104 so that the optical axis of the laser beam emitted from the laser light source 110 is substantially parallel to the principal surface 104A of the substrate 104. Furthermore, an entirety of the upper surface 106A of the light-transmitting member 106 is covered with an upper light reflection coat 112A, and an entirety of the lower surface 106B of the light-transmitting member 106 except for the bottom recess 108 is covered with a lower light reflection coat 112B.

Airtight bonding is provided between the principal surface 104A of the substrate 104 and the lower surface 106B of the light-transmitting member 106, on which the lower light reflection coat 112B is disposed. The laser light source 110 is arranged in the bottom recess 108 that is sealed from the outside.

The substrate 104 further includes two wiring layers (or leads) (not explicitly shown) made of an electrically conductive material and serving as an anode and a cathode, respectively. One of the two wiring layers is electrically connected to an n-electrode at a lower surface side of the laser light source 110, while the other of the two wiring layer is electrically connected to a p-electrode at an upper surface side of the laser light source 110 via a wire 140 (see FIG. 1B). A space that allows the wire 140 to pass therethrough is present between the upper surface of the laser light source 110 and a top surface of the bottom recess 108 at an upper side of the bottom recess 108.

During manufacturing, performing bonding of the wire 140 to the wiring layer and then bonding of the wire 140 to the p-electrode at the upper side of the laser light source 110 allows for reducing a space between the upper surface of the laser light source 110 and the surfaces defining the bottom recess 108 at an upper side of the bottom recess 108.

Alternatively, in the case where the p- and n-electrodes can be both arranged at the lower surface side of the light source, the wire 140 does not need to be disposed, allowing the space between the upper surface of the laser light source 110 and surfaces defining the bottom recess 108 to have a size in view of tolerance in dimensions of those members. With this arrangement, a thickness of the light source device may be further reduced. The space between lateral surfaces of the laser light source 110 and lateral surfaces defining the bottom recess 108 may have a size in view of the tolerance in dimensions of those members.

Examples of a material of the substrate 104 for mounting the laser light source 110 thereon include a silicon material, and other appropriate electrically-insulating material such as a resin, glass, and a ceramic. For the light-transmitting member 106, for example, glass may be used, or a resin material may be used depending on the conditions of temperature or the like.

Each of the light reflection coats 112A, 112B is a metal film made of aluminum, gold, silver, or the like, and may be formed on the surfaces 106A and 106B of the light-transmitting member 106 by vapor deposition or the like. Further, a reflection-enhancing film made of a multilayered dielectric film may be disposed between the metal film and the glass. With this arrangement, reflectance can be further increased by utilizing interference of light.

For the laser light source 110, any appropriate laser light source configured to emit a laser beam having a wavelength in the range of visible light may be used. In accordance with the intended use, a light source configured to emit a laser beam with a wavelength in the range of ultraviolet or infrared light may be used.

The principal surface 104A of the substrate 104 and the lower surface 106B of the light-transmitting member 106 covered with the lower light reflection coat 112B may be bonded together via the wiring layer used as an adhesive layer or via an adhesive material. More specifically, a gold (Au) layer may be disposed on each of the principal surface 104A of the substrate 104 and the lower surface 106B of the light-transmitting member 106 such that Au—Au bonding may be made between the surfaces 104A and 106B.

As described above, the light source device 102 is configured to output a laser beam in a direction substantially parallel to the principal surface 104A of the substrate 104, on which the laser light source 110 is mounted. Such a light source may be attached to an end portion of a light guide plate to be used effectively for a backlight device, for example. In that case, it is desirable that the dimension of the light source device in a thickness direction be reduced so as to be adjusted to the thickness of the light guide plate.

However, laser beam emitted from the laser light source travels while spreading to a certain degree. Accordingly, a reduction in size of the light source device in the height direction may allow a laser beam to leak through an upper surface side of the light source device or be absorbed into the substrate at a lower surface side of the light source device, which may increase possibility of decline in the output efficiency of the light source device.

In the light source device 102, the upper surface 106A of the light-transmitting member 106 is covered with the upper light reflection coat 112A, and the lower surface 106B of the light-transmitting member 106 is covered with the lower light reflection coat 112B. With this arrangement, even in the case where the size of the light-transmitting member 106 in the height direction is reduced, a laser beam emitted from the laser light source 110 may be reflected toward the inside of the light-transmitting member 106, so that the laser beam emitted from the laser light source 110 can be output highly efficiently. Accordingly, the light source device 102 with a size reduced in the height direction that can exhibit high output efficiency can be realized. Further, the upper light reflection coat 112A is disposed on the upper surface of the light-transmitting member 106, so that airtightness of the bottom recess may not be reduced.

Furthermore, a light incident region 108A of the light-transmitting member 106 at the bottom recess 108 (see FIG. 1C) and a lateral surface 106C of the light-transmitting member 106, which is located anterior to the light incident region 108A and allows the laser beam to be emitted therethrough (see FIG. 1C), can be covered with an antireflection coat made of a multilayer dielectric film, which may increase transmittance of light.

The light-transmitting member 106, which is solid except for the bottom recess 108 at which the laser light source 110 is arranged, is bonded airtight to the substrate 104. This allows for reducing possibility of causing damage to the laser light source 110 or other members even after a long period of use, so that longer operation life of the light source device 102 can be achieved.

Further, with the laser light source 110 arranged such that the lower surface of the laser light source 110 with the n-electrode is located on the principal surface 104A of the substrate 104, the major axis of the far field pattern of a laser beam emitted from the laser light source 110 extends in an upper-lower direction. In this arrangement, a laser beam is spread in an upper-lower direction greater than in a lateral direction, if the light reflection coats 112A, 112B are not provided, a decrease in the size of the light source device in the upper-lower direction may further allow the light to leak through the upper surface or be absorbed into the underlying substrate.

However, with the present embodiment, even in the case where the major axis of the far-field pattern of the laser beam extends in the upper-lower direction, the light reflection coats 112A and 112B at upper and lower sides of the light-transmitting member 106 allow the laser beam to be surely reflected toward inside of the light-transmitting member 106. Thus, a laser beam emitted from the laser light source 110 may be output highly efficiently.

Optionally, in the present embodiment, the region of the light-transmitting member 106 to be irradiated with a laser beam emerges may be roughened. More specifically, the light incident region 108A of the bottom recess 108 of the light-transmitting member 106 (see FIG. 1C) and the lateral surface 106C of the light-transmitting member 106 (see FIG. 1C) located anterior to the light incident region 108A may be roughened. With this arrangement, laser beam output from the light source device 2 may be spread more laterally. That surface of the light-transmitting member 106 may be roughened by blasting, etching, dicing, or any other appropriate technique.

As shown in FIG. 1B, the distance L1 between an emission-side end portion of the laser light source 110, through which the laser beam is emitted, and an emission-side end portion of the light-transmitting member 106, through which the laser beam emerges from the light source device 102, is longer than the distance L2 between the other end portion of the laser light source 110 opposite to the emission-side end portion thereof and the other end portion of the light-transmitting member 106 opposite to the emission-side end portion thereof.

With the distance L1 on the emission-side end portion of the laser light source 110 being longer than the distance L2 on the other end portion thereof, a laser beam emitted from the laser light source 110 can be spread more laterally. This allows the light source device to be effectively used for a backlight device or the like.

With the far-field pattern of the laser beam having a minor axis that extends in the lateral direction, a laser beam may not easily leak through a lateral surface of the light-transmitting member 106 even in the case where the distance L1 is longer than the distance L2. In the upper-lower direction, a laser beam is reflected toward inside the light-transmitting member 106 by the light reflection coats 112A and 112B, so that leakage of a laser beam may not occur.

Figure 1D:
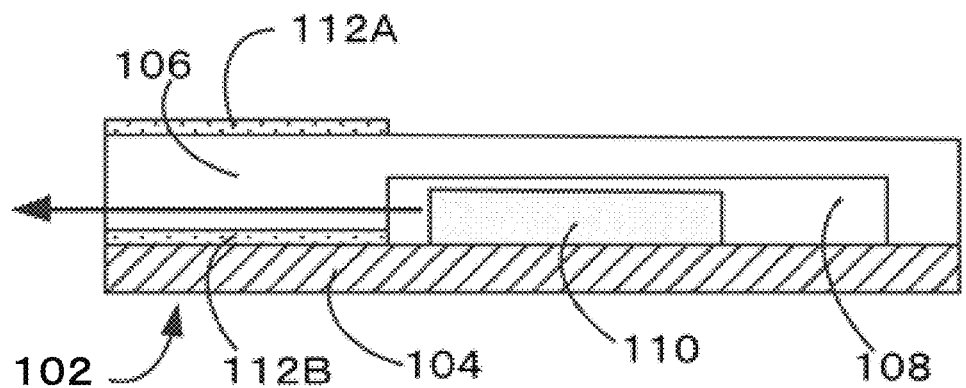
FIG. 1D is a cross-sectional view showing a variant example of the light source device according to the first embodiment.

Next, a variant example of the light source device 102 in which the light reflection coats are provided in areas different from those in FIG. 1B will be described with reference to FIG. 1D. FIG. 1D is a cross-sectional view showing the variant example of the light source device 102, and shows a plane corresponding to the plane shown in FIG. 1B.

In the variant example shown in FIG. 1D, the upper light reflection coat 112A is formed on the upper surface 106A of the light-transmitting member 106 only in a region to be irradiated with the laser beam. Also, the lower light reflection coat 112B is formed on the lower surface 106B of the light-transmitting member 106 only in a region to be irradiated with the laser beam.

Light Source Device According to Second Embodiment of the Present Disclosure

Figure 2:
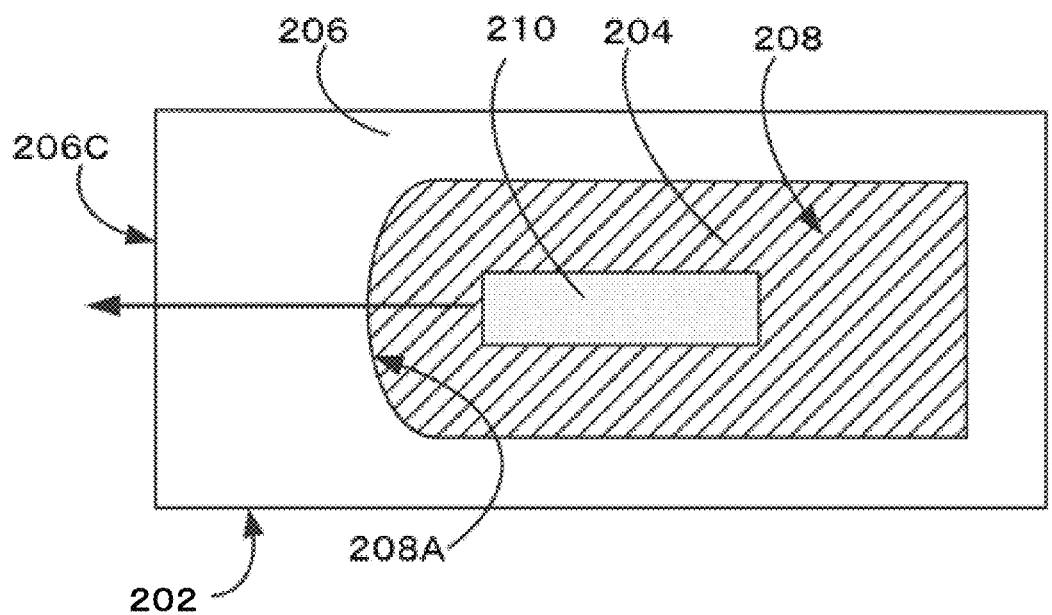
FIG. 2 is a plan sectional view showing a light source device according to a second embodiment of the present disclosure.

Next, a light source device 202 according to a second embodiment of the present disclosure will be described with reference to FIG. 2. FIG. 2 is a plan sectional view showing the light source device 202 in which a bottom recess 208 of a light-transmitting member 206 has a shape different from that in the light source device 102, and shows a plane corresponding to the plane shown in FIG. 1C. In the description of the second embodiment below, explanation will be given on configurations different from that in the first embodiment, and explanation on configurations similar to those in the first embodiment may be omitted.

As shown in FIG. 2, a laser beam incident region 208A of surfaces defining the bottom recess 208 has a shape of a concave lens so that the incident laser beam is spread in a direction parallel to the principal surface 204A of the substrate 204.

In the present embodiment, with the laser beam incident region 208A of surfaces defining the bottom recess 208 having the shape of a concave lens that allows the incident laser beam to be spread laterally, a light source device that can output a sufficiently laterally divergent laser beam while having a small size in a height direction can be realized. In the upper-lower direction, a laser beam is reflected by the upper light reflection coat 212A and lower light reflection coat 212B, so that light may be output highly efficiently.

Light Source Device According to Third Embodiment of the Present Disclosure

Figure 3A:
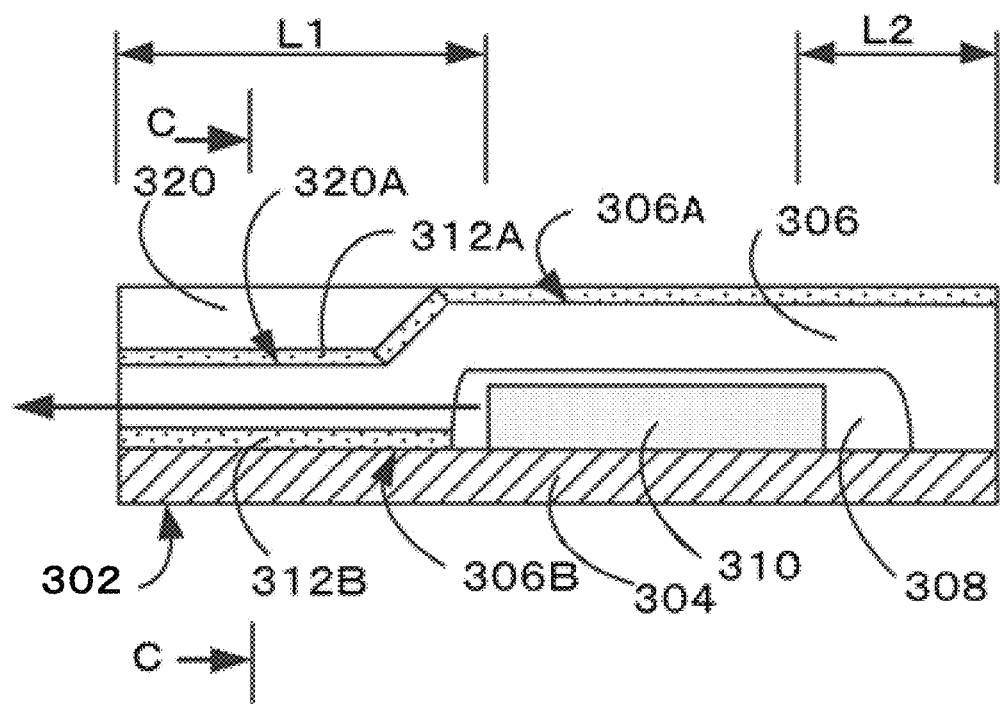
FIG. 3A is a cross-sectional view showing a light source device according to a third embodiment of the present disclosure
Figure 3B:
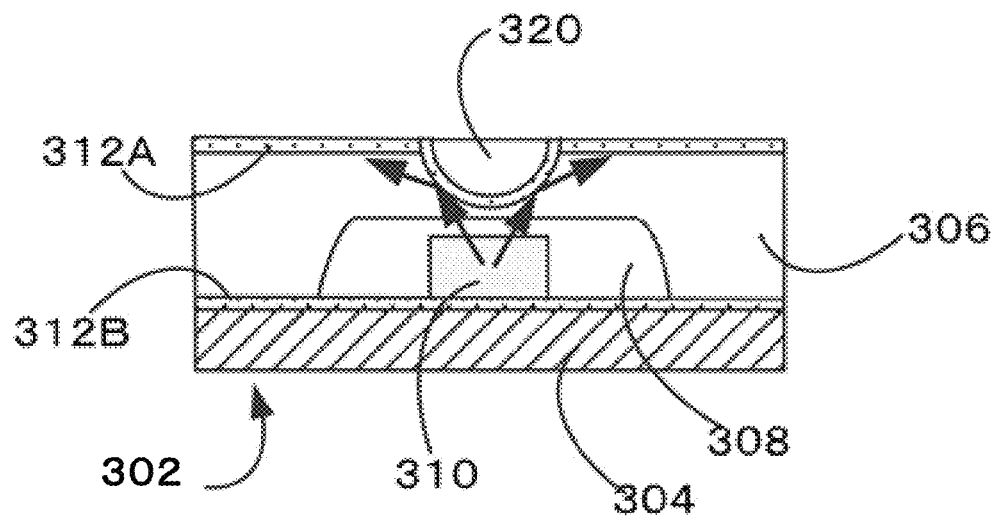
FIG. 3B is a cross-sectional view taken along the line C-C shown in FIG. 3A and viewed from an emission side of the light source device.

Next, a light source device 302 according to a third embodiment of the present disclosure will be described with reference to FIGS. 3A and 3B. FIG. 3A is a cross-sectional view showing the light source device 302 including the light-transmitting member 306 that further has a top recess 320, and shows a plane corresponding to FIG. 1B. FIG. 3B is a cross-sectional view taken along the line C-C shown in FIG. 3A and viewed from an emission-end side of the laser light source 310. In the description of the third embodiment below, explanation will be given on configurations different from those in the first embodiment, and explanation on configurations similar to those in the first embodiment may be omitted.

As shown in FIG. 3A, the light-transmitting member 306 has a top recess 320 opening upward in a portion of an upper surface 306A to be irradiated with the laser beam, and a portion of an upper light reflection coat 312A covers the top recess 320. The upper light reflection coat 312A may be disposed only on the top recess 320. Accordingly, in the present embodiment, at least a portion of the upper light reflection coat 312A covers the top recess 320.

With this arrangement, a surface 320A of the top recess 320 is covered with the upper light reflection coat 312A that reflects light, which allows a laser beam to be reflected so that the laser beam is spread outward in the lateral direction as shown in FIG. 3B. This provides a light source device 302 that outputs sufficiently divergent light while using a laser light source that originally emits a coherent laser beam. Thus, this light source device can be broadly applied to various types of lighting. Further, at least one of the region covered with the upper light reflection coat 312A and the region covered with the lower light reflection coat 312B has a roughened surface.

Furthermore, as can be seen from FIG. 3A, the bottom recess 308 and the top recess 320 of the light-transmitting member 306 are arranged so as not to overlap with each other in a plan view. Avoiding overlap between the bottom recess 308 and top recess 320 in a plan view (i.e., when this light source device 302 is viewed in plan from above) allows this light source device 302 to reduce a thickness thereof while maintaining a certain degree of mechanical strength.

On the other hand, in accordance with requirement in size of the light source device 302 in a height direction due to a place where the light source device 302 is to be installed, the top recess 320 may be formed in the upper surface 306A of the light-transmitting member 306 also in a region not to be irradiated with the laser beam. In that case, the bottom recess 308 and the top recess 320 may be arranged to overlap with each other in a plan view.

Furthermore, as can be seen in FIG. 3B, in a cross section of the light source device 302 perpendicular to the optical axis of the laser beam, the top recess 320 has a shape that is substantially symmetric with respect to an imaginary line that passes through the optical axis and is perpendicular to the principal surface of the substrate 304. The recess 302 with such a shape allows the output laser beam to be spread symmetrically with respect to the optical axis.

Light Source Device According to Fourth Embodiment of the Present Disclosure

Figure 4A:
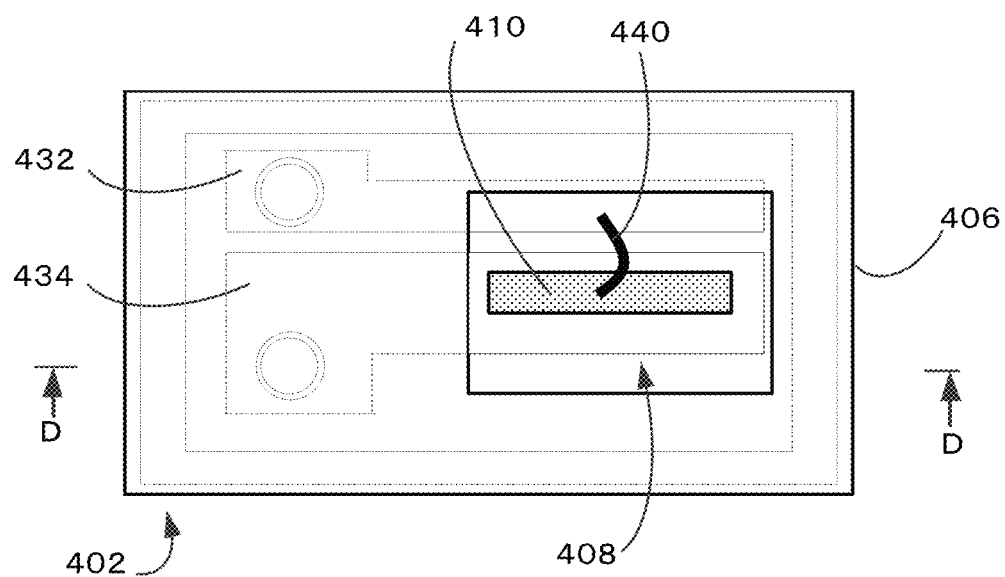
FIG. 4A is a plan sectional view showing a light source device according to a fourth embodiment of the present disclosure.
Figure 4B:
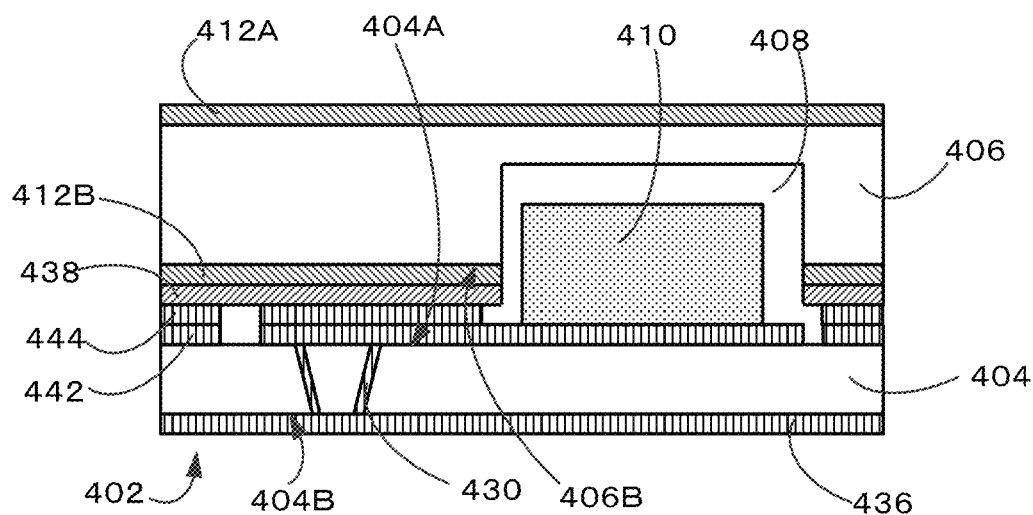
FIG. 4B is a cross-sectional view taken along the line D-D shown in FIG. 4A.

Next, a light source device 402 according to a fourth embodiment of the present disclosure will be described with reference to FIGS. 4A and 4B. FIG. 4A is a plan sectional view taken along a plane corresponding to the plane B-B shown in FIG. 1B. FIG. 4B is a cross-sectional view taken along the plane D-D shown in FIG. 4A and illustrates the light source device 402 with a via hole 430. In the description of the fourth embodiment below, explanation will be given on configurations different from those in the first embodiment, and explanation on configurations similar to those in the first embodiment may be omitted.

The substrate 404 includes an anode wiring layer 432 and a cathode wiring layer 434. The cathode wiring layer 434 is electrically connected to an n-electrode at a lower surface side of the laser light source 410. The anode wiring layer 432 is electrically connected to a p-electrode at an upper surface side of the laser light source 410 via a wire 440.

A substrate-side bonding layer 442 is arranged on the principal surface 404A of the substrate 404, and a light-transmitting-member-side bonding layer 444 is arranged on the substrate-side bonding layer 442. More specifically, the substrate-side bonding layer 442 and light-transmitting-member-side bonding layer 444 are each made of Au and are bonded together by Au—Au bonding. Further, an insulating layer 438 is arranged on the light-transmitting-member-side bonding layer 444, and the lower light reflection coat 412B is arranged on the insulating layer 438. The light-transmitting member 406 is bonded onto the lower light reflection coat 412B. That is, the principal surface 404A of the substrate 404 and the lower surface 406B of the light-transmitting member 406 are bonded together via the substrate-side bonding layer 442 and light-transmitting-member-side bonding layer 444, the insulating layer 438, and the lower light reflection coat 412B. A wiring layer 436 is arranged on the back surface 404B of the substrate 404.

In the present embodiment, a via hole 430 is provided through the substrate 404 to electrically connect the substrate-side bonding layer 442 on the principal surface 404A of the substrate 404 to the wiring layer 436 on the back surface 404B of the substrate 404. The lower surface 406B of the light-transmitting member 406 in a region to be irradiated with the laser beam is covered with the lower light reflection coat 412B. With this arrangement, the via hole 430 is sealed not only on a bottom thereof in contact with the wiring layer 436 but also on a top thereof that is in contact with the lower light reflection coat 412B. That is, the inside of the bottom recess 408 at which the laser light source 410 is arranged are sealed from the outside.

Light Source Device According to Fifth Embodiment of the Present Disclosure

In the first to fourth embodiments described above, the case where an emission surface of the light-transmitting member is located anterior to the emission-end portion of the laser light source. In the fifth embodiment, a surface at a lateral side of the emission-side end portion of the laser light source (e.g., a surface at a bottom side of FIG. 1C) serves as the emission-side end portion of the light-transmitting member. More specifically, in the fifth embodiment, a mirror is arranged inside the recess of the light-transmitting member on the principal surface of the substrate to change the traveling direction of the laser beam to a direction parallel to the principal surface of the substrate and perpendicular to the initial traveling direction of the laser beam.

Various embodiments and implementations of the present disclosure described above may have their constituents modified, replaced, or combined in any arbitrary manner, or may even have their order of stacking, performing, or arranging changed, without departing from the scope or spirit of the present disclosure as defined only by the appended claims.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light source device comprising:
    a substrate having a principal surface;
    a light-transmitting member arranged on the principal surface of the substrate, the light-transmitting member having a lower surface that faces the principal surface of the substrate, an upper surface opposite to the lower surface, and a bottom recess opening downward; and
    a laser light source arranged on the principal surface at a portion inside the bottom recess, wherein
        the laser light source is arranged on the principal surface so that an optical axis of a laser beam emitted from the laser light source is substantially parallel to the principal surface,
        at least a portion of the upper surface of the light-transmitting member to be irradiated with the laser beam is covered with an upper light reflection coat, and
        at least a portion of the lower surface of the light-transmitting member to be irradiated with the laser beam is covered with a lower light reflection coat.

2. The light source device according to claim 1, wherein the laser beam emitted from the laser light source has a far field pattern having a major axis that extends in a direction perpendicular to the principal surface of the substrate.

3. The light source device according to claim 2, wherein one of surfaces defining the recess includes a region on which the laser beam is incident, and the region on which the laser beam is incident has a shape of a concave lens that allows the incident laser beam to spread in a direction parallel to the principal surface of the substrate.

4. The light source device of according to claim 3, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

5. The light source device of according to claim 2, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

6. The light source device according to claim 1, wherein one of surfaces defining the recess includes a region on which the laser beam is incident, and the region on which the laser beam is incident has a shape of a concave lens that allows the incident laser beam to spread in a direction parallel to the principal surface of the substrate.

7. The light source device of according to claim 6, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

8. The light source device according to claim 1, wherein a region of the light-transmitting member through which the laser beam emerges has a roughened surface.

9. The light source device of according to claim 8, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

10. The light source device of according to claim 1, wherein
    the light-transmitting member has a top recess opening upward and located in at least the region of the upper surface of the light-transmitting member to be irradiated with the laser beam, and
    at least a portion of the upper light reflection coat covers the top recess.

11. The light source device according to claim 10, wherein at least one of the region covered with the upper light reflection coat and the region covered with the lower light reflection coat has a roughened surface.

12. The light source device of according to claim 11, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

13. The light source device according to claim 10, wherein, in a plan view of the light source device, the bottom recess and top recess of the light-transmitting member do not overlap with each other.

14. The light source device of according to claim 13, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

15. The light source device according to claim 10, wherein, in a cross-sectional view of the light source device perpendicular to the optical axis of the laser beam, the top recess has a shape that is substantially symmetric with respect to an imaginary line that passes through the optical axis and is perpendicular to the principal surface.

16. The light source device of according to claim 15, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

17. The light source device of according to claim 10, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

18. The light source device of according to claim 1, wherein a distance between an emission-end portion of the laser light source, through which the laser beam is emitted, and an emission-end portion of the light-transmitting member, through which the laser beam emerges from the light source device, is longer than a distance between an end portion of the laser light source at a side opposite to the emission-end portion of the laser light source and an end portion of the light-transmitting member at a side opposite to the emission-end portion of the light-transmitting member.

* * * * *